United States Patent
McDougall et al.

(10) Patent No.: US 9,971,001 B2
(45) Date of Patent: May 15, 2018

(54) VOLUME ARRAY COIL WITH ENFORCED UNIFORM ELEMENT CURRENTS FOR IMPROVED EXCITATION HOMOGENEITY

(71) Applicant: The Texas A&M University System, College Station, TX (US)

(72) Inventors: Mary P. McDougall, College Station, TX (US); Steven M. Wright, College Station, TX (US)

(73) Assignee: The Texas A&M University System, College Station, TX (US)

( * ) Notice: Subject to any disclaimer, the term of this patent is extended or adjusted under 35 U.S.C. 154(b) by 394 days.

(21) Appl. No.: 13/687,863

(22) Filed: Nov. 28, 2012

(65) Prior Publication Data

US 2013/0134979 A1   May 30, 2013

Related U.S. Application Data

(60) Provisional application No. 61/564,170, filed on Nov. 28, 2011, provisional application No. 61/638,213, filed on Apr. 25, 2012.

(51) Int. Cl.
G01R 33/34 (2006.01)
G01R 33/36 (2006.01)

(52) U.S. Cl.
CPC ....... *G01R 33/34* (2013.01); *G01R 33/34046* (2013.01); *G01R 33/36* (2013.01)

(58) Field of Classification Search
CPC .. G01R 33/34; G01R 33/34046; G01R 33/36; G01R 33/34061; G01R 33/34069
USPC .......................... 324/318–322; 600/410, 415
See application file for complete search history.

(56) References Cited

U.S. PATENT DOCUMENTS

| | | | |
|---|---|---|---|
| 7,336,074 B2 | 2/2008 | Yang | 324/318 |
| 7,714,581 B2* | 5/2010 | Erickson et al. | 324/322 |
| 7,777,493 B2* | 8/2010 | Desvaux | G01R 33/3628 324/318 |
| 8,441,259 B2* | 5/2013 | Zhai et al. | 324/318 |
| 2005/0275403 A1* | 12/2005 | Pinkerton | G01R 33/34046 324/318 |
| 2009/0224762 A1* | 9/2009 | Mehr | G01R 33/583 324/314 |

(Continued)

OTHER PUBLICATIONS

McDougall, Mary P. et al., "A Simple Approach to Overcoming Mutual Coupling Effects in Some Transmit Array Coils for Magnetic Resonance Imaging", 30th Annual IEEE EMBS Conference, Vancouver, British Columbia, Canada, Aug. 20-24, 2008, pp. 2043-2046, © 2008 IEEE.*

(Continued)

*Primary Examiner* — Rishi Patel
(74) *Attorney, Agent, or Firm* — Winstead PC

(57) ABSTRACT

Each of the coils in a transmit coil array of a magnetic resonance imaging apparatus is electrically connected to a common voltage point by a transmission line. By controlling the electrical length of the transmission line connecting each of the coils to the common voltage point to an odd integer multiple of one quarter wavelength, the current delivered to each coil is independent of coil impedance. This principle of forced current excitation enables equal currents to be delivered to each coil of a magnetic resonance imaging transmit coil array regardless of the unique loading of the individual coils and mutual impedance between the coils.

15 Claims, 5 Drawing Sheets

(56) References Cited

U.S. PATENT DOCUMENTS

| | | | |
|---|---|---|---|
| 2011/0098532 A1* | 4/2011 | Graumann et al. | 600/117 |
| 2011/0121830 A1* | 5/2011 | Ma et al. | 324/318 |
| 2011/0163751 A1* | 7/2011 | Pinkerton et al. | 324/322 |
| 2011/0215807 A1* | 9/2011 | Misic et al. | 324/322 |
| 2012/0268132 A1* | 10/2012 | Zhu et al. | 324/322 |
| 2012/0280683 A1* | 11/2012 | Sacolick et al. | 324/309 |
| 2013/0093425 A1* | 4/2013 | Chu et al. | 324/318 |

OTHER PUBLICATIONS

Rispoli et al. "A Quadrature Volume Transmit Coil for Breast Imaging and Spectroscopy at 7 Tesla" ISMRM 20 (2012) page.*

Feng et al. "Transmit / Receive Single Echo Imaging" ISMRM 19 (2011) p. 333.*

McDougall et al. "A Printed Loop Element with Integrated Capacitors and Co-Planar Shield for 7 Tesla" ISMRM 19 (2011) p. 1875.*

Hollingsworth et al. "An Easily Integrated Eight Channel Parallel Transmit System for Transmit SENSE Applications" ISMRM 19 (2011) p. 3832.*

Wright et al. "Simple Approaches to Current Control for Transmit Array Elements at 7 Tesla" ISMRM 19 (2011) p. 3847.*

Wright, S.M., McDougall, M.P., Dimitrov, I.E., Cheshkov, S., and Malloy, C.R., "Simple Approaches to Current Control for Transmit Array Elements at 7 Tesla," Proc. of the $19^{th}$ Ann. Meeting of the International Society of Magnetic Resonance in Medicine (ISMRM), Montreal, Quebec, Canada, p. 3847, May 2011.

McDougall, Mary P.; Knight, Jason M.; Eigenbrodt, Edwin E.; Wright, Steven M.; Chang, Chieh-Wei; , "A simple approach to overcoming mutual coupling effects in some transmit array coils for magnetic resonance imaging," *$30^{th}$ Annual International Conference of the IEEE Engineering in Medicine and Biology Society*, pp. 2043-2046, Aug. 20-25, 2008.

Wright, S.M., Course Notes for Phased Array Antennas ECEN 636, Texas A&M University, pertinent pp. 35-39, course notes presented since mid-1990s.

McDougall, Mary P., and Wright, Steven M., Annual Report Year 1:Apr. 1, 2010-Mar. 31, 2011, Project RP100625 sponsored by the Cancer Prevention and Research Institute of Texas.

* cited by examiner

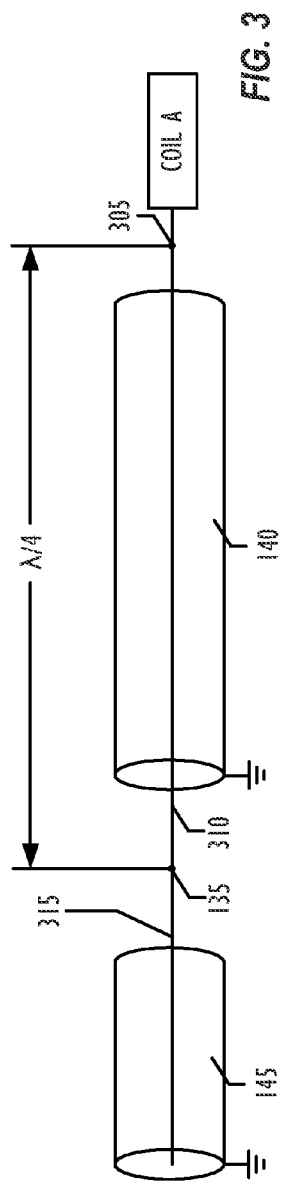
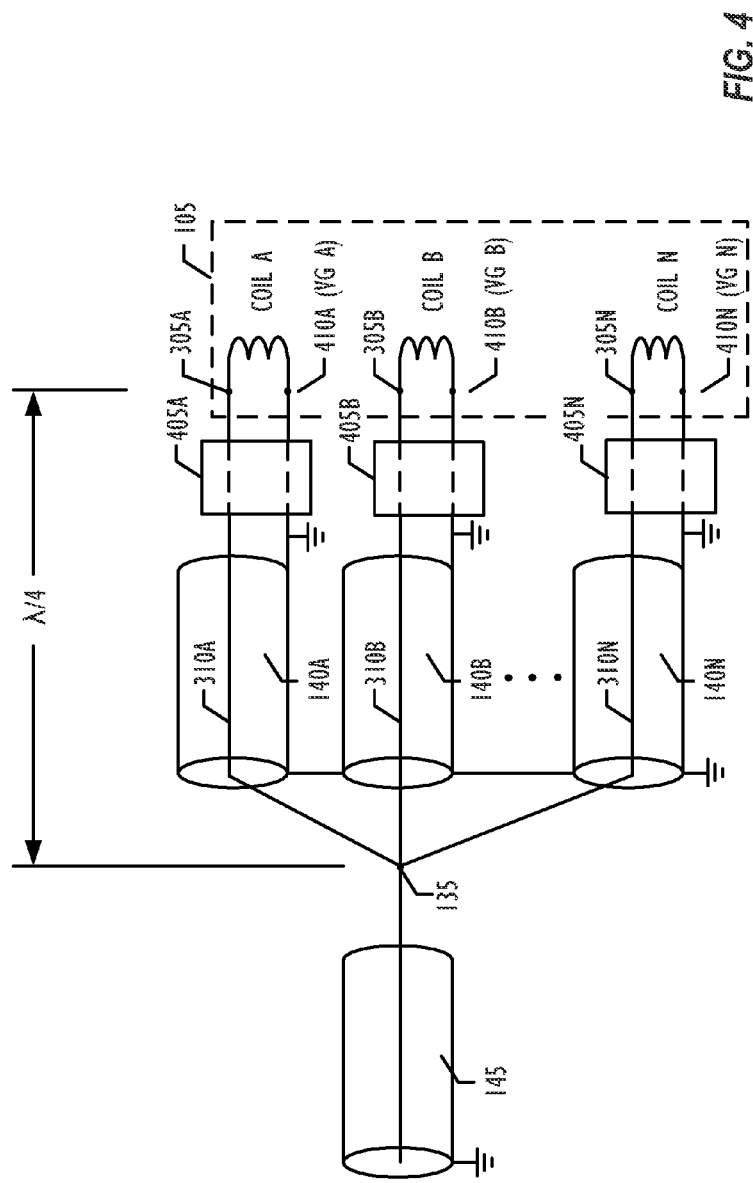

VOLUME ARRAY COIL WITH ENFORCED UNIFORM ELEMENT CURRENTS FOR IMPROVED EXCITATION HOMOGENEITY

CROSS-REFERENCE TO RELATED APPLICATIONS

This application claims priority to U.S. Provisional Application Ser. No. 61/564,170, filed Nov. 28, 2011, and to U.S. Provisional Application Ser. No. 61/638,213, filed Apr. 25, 2012, each of which is incorporated herein by reference in its entirety, including any Appendices.

STATEMENT REGARDING GOVERNMENT INTERESTS

This work was supported in part by a grant from the Cancer Prevention and Research Institute of Texas (Award Reference No, RP100625). The Government may have certain rights in this invention.

FIELD OF THE DISCLOSURE

This disclosure relates generally to controlling currents to the input terminal of each element of a magnetic resonance imaging (MRI) radio frequency (RF) transmit array. More specifically, but not by way of limitation, this disclosure relates to a system and method of controlling the length of a transmission line between a common voltage point and the input terminal of each element in an MRI transmit array to enforce equal currents to the input terminal of each element.

BACKGROUND

Magnetic resonance imaging (MRI) takes advantage of the magnetic properties exhibited by many atomic nuclei and the presence of these atomic nuclei within a sample tissue to create detailed images of internal structures. In the absence of an external magnetic field, the spins of magnetic nuclei are oriented randomly. However, when placed within a strong, static magnetic field ($B_0$), the spinning nuclei adopt one of two orientations—they either align with the $B_0$ field or against the $B_0$ field. The first orientation, in which a particular nucleus is aligned with the $B_0$ field, is slightly lower in energy than the second orientation, in which a nucleus is aligned against the $B_0$ field. An MRI apparatus typically employs a primary electromagnet to generate the strong, static $B_0$ field. By exciting the nuclei in the first orientation with a RF magnetic field ($B_1$) at a frequency that corresponds to the energy differential between the first orientation and the second orientation, the nuclei in the first orientation absorb energy and "flip" to the second orientation. After excitation, the nuclei undergo a transition back to the first orientation. During this transition, the nuclei emit the absorbed energy as RF signals. These signals are captured by a RF receiver and are used to compile the image.

The difference in energy between the first and second orientations is based on the type of atom and the strength of the $B_0$ field. It is desirable to perform MRI imaging utilizing a higher strength static magnetic field $B_0$ because higher strength $B_0$ fields lead to increased signal to noise (SNR) ratio. However, increased static field strengths also lead to certain problems. For example, because the energy differential between the first and second orientations increases with increasing static field strength, so too does the RF energy required to induce the transition from the first orientation to the second orientation. As such, the frequency of the RF signal to generate the $B_1$ field is increased. By way of example, RF energy of approximately 64 MHz is required to bring a $^1H$ nucleus into resonance at a static field strength of 1.5 Tesla whereas RF energy of approximately 300 MHz is required at a field strength of 7 Tesla.

MRI systems utilize radio frequency transmit coils to produce the $B_1$ excitation field. These coils are designed in varying shapes, sizes, and configurations depending on the particular application. For example, a surface coil is contained in a single plane and is placed in proximity to a region to be imaged. In contrast, a volume coil, such as a birdcage coil or a solenoid coil, surrounds a volume to be imaged. At the higher frequencies required to induce the transition from the first orientation to the second orientation at higher static field strengths, interactions between the RF field and the tissue being imaged result in non-uniform $B_1$ fields in the tissue. This $B_1$ field inhomogeneity reduces the quality of images obtained by the MRI system. A well-known solution to provide a more uniform $B_1$ field throughout a volume of tissue being imaged utilizes multiple RF transmit coils (i.e., a transmit coil array) positioned about the volume rather than a single RF transmit coil. By optimizing the relative magnitudes and phases of the currents on the multiple coils, the $B_1$ field can be made more homogeneous.

While the positioning of coils in a transmit array can produce a more uniform $B_1$ field throughout a volume of tissue being imaged, transmit arrays also lead to certain problems. In order to produce a uniform $B_1$ field, it is necessary to control the current flowing through each coil of the array. However, because the RF pulse is generally defined by a voltage level input to an amplifier, the unique loading of each of the coils may lead to different currents on the coils. For example, the properties of the tissue that is located in proximity to a particular coil will affect the impedance of that coil. Therefore, coils in different positions will have different impedances based on their proximity to tissues having different properties. To further complicate matters, the coils in a transmit array may be inductively coupled such that a change in current flowing through one coil induces a voltage on another coil. The mutual inductive coupling of coils in a transmit array makes it even more difficult to control the current delivered to a coil in the array.

One proposed solution to control currents on each coil of a transmit array utilizes a separate isolation power amplifier to supply each coil. Isolation power amplifiers differ from conventional power amplifiers in that they effectively present a blocking impedance to the coil. This essentially removes the effects of mutual inductive coupling, allowing each coil to be programmed separately. While this method may allow each coil to be independently programmed, there are certain drawbacks to this approach. First, because MRI transmit coils may operate at "non-standard" frequencies and high power ratings, isolation power amplifiers with the required characteristics may not be common items and may therefore be quite expensive. Moreover, a separate isolation power amplifier is required for each coil in the transmit array. Second, while the isolation power amplifier solution may remove the effects of mutual inductive coupling, each coil in a transmit array will still exhibit different loading characteristics based on the properties of the coil and its positioning. Thus, each coil in a transmit array must be separately tuned to provide equal currents to each of the coils. While this is a workable solution, it is desirable to supply each coil in a transmit array from a common amplifier and to tune the system as a whole. There is therefore a need in the art for an MRI system in which a single amplifier can deliver uniform currents to each coil in a transmit array.

BRIEF DESCRIPTION OF THE DRAWINGS

FIG. 3 illustrates a connection between a common voltage point and a coil in a transmit coil array in which the current at the input to the coil is independent of the coil impedance in accordance with an embodiment of the disclosure.

FIG. 4 illustrates the connection of multiple coils in a transmit coil array to a common voltage point whereby the current at the input to each of the coils is equal based on the electrical length of the transmission line between the common voltage point and the input in accordance with an embodiment of the disclosure.

DETAILED DESCRIPTION

The following is a detailed description for carrying out embodiments of the invention. This description is not to be taken in a limiting sense, but is made merely for the purpose of illustrating the general principles of the example embodiments of the invention.

Figure 1:
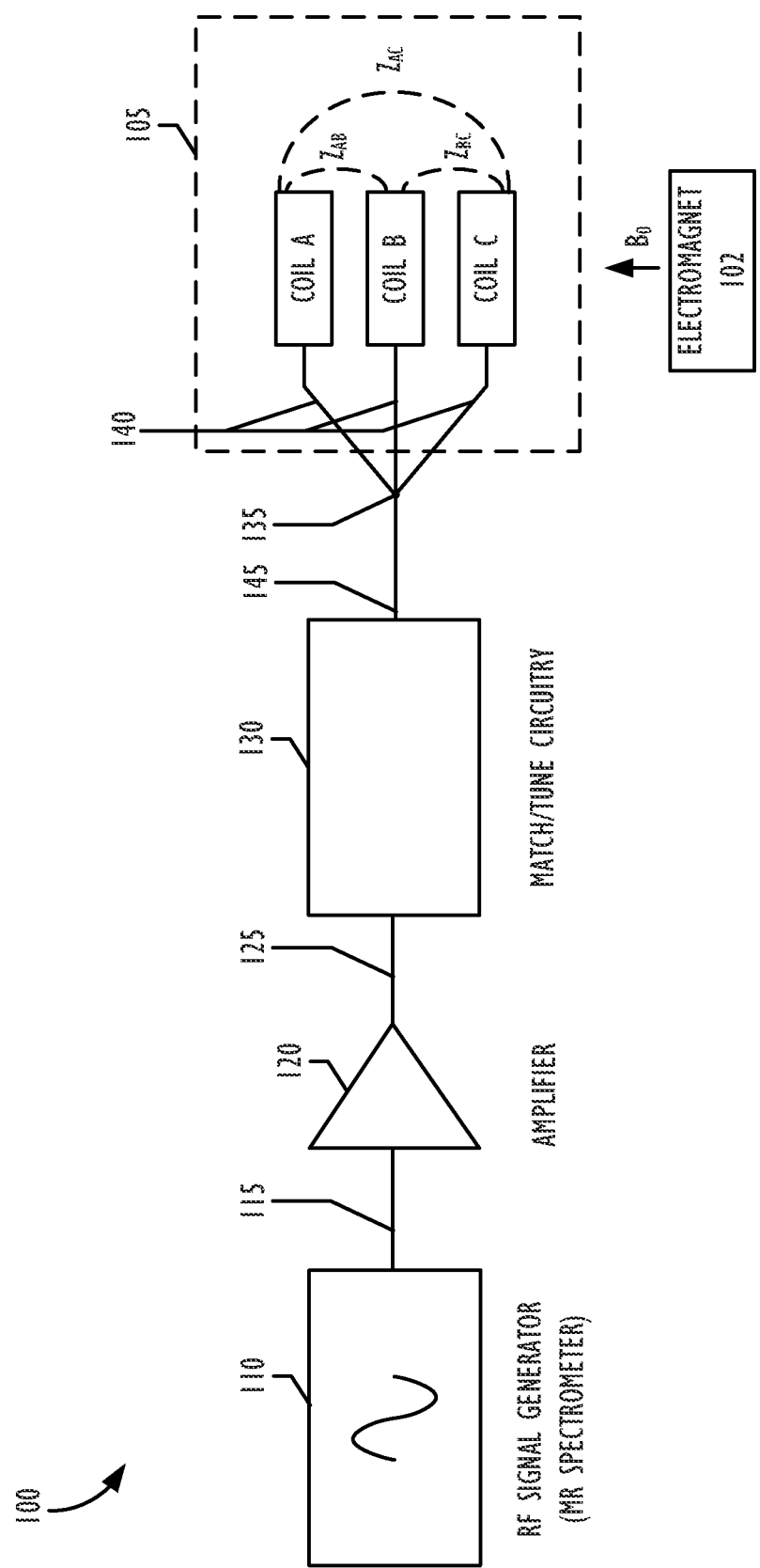
FIG. 1 is a block diagram illustrating the major components of the drive system of a transmit coil array in accordance with an embodiment of the disclosure.

Referring to FIG. 1, the major components of the drive system for a transmit coil array of an MRI system in accordance with an embodiment of the disclosure are illustrated. As described above, the individual coils (e.g., Coils A, B, and C) in a transmit array 105 may be positioned about a volume being imaged in order to achieve a more uniform excitation field throughout the volume. While FIG. 1 illustrates a transmit array 105 having three individual coils, the disclosure is not limited by the number of coils in the array. Rather, a transmit array can comprise any number of coils greater than a single coil. An RF signal generator 110 generates an RF signal having a desired waveform at the Larmor frequency (i.e., the frequency required to generate the transition from the first orientation to the second orientation for the particular nuclei of interest). The RF signal is conducted via a transmission line 115 (typically a coaxial cable) to an amplifier 120 where the power of the RF signal is increased. In a typical arrangement, the amplifier 120 has an output impedance of 50 ohms. The output power of the amplifier varies based on the properties of the MRI system. At static fields ($B_0$) in the range of 3 T, produced by electromagnet 102, the power output of the amplifier may be as high as 35 kW. However, at the higher frequencies associated with higher static fields, the power output of the amplifier is typically limited. For example, in one embodiment, for $^1H$ imaging at 7 T, the power output of the amplifier 120 may be on the order of 4 kW. The amplified signal is conducted via a transmission line 125 (typically a coaxial cable) to match and tune circuitry 130. As is known in the art, the match and tune circuitry allows the load of the system to be matched to the output impedance of the amplifier 120 such that maximum power transfer is obtained. The output signal from the match and tune circuitry 130 is conducted through a transmission line 145 (typically a coaxial cable) to a common voltage point 135. Each of the individual coils of the transmit array 105 are fed from the common voltage point 135 by individual transmission line segments 140 (again, typically coaxial cable). As described above, the impedance of each coil varies based on several parameters. For example, the impedance of an individual coil may be based on the design of the coil, the placement of the coil with respect to an area being imaged, and the mutual impedance based on the inductive coupling of coils in an array (e.g., the mutual impedance between coils A and B ($Z_{AB}$), between coils B and C ($Z_{BC}$), and between coils A and C ($Z_{AC}$).

Figure 2:
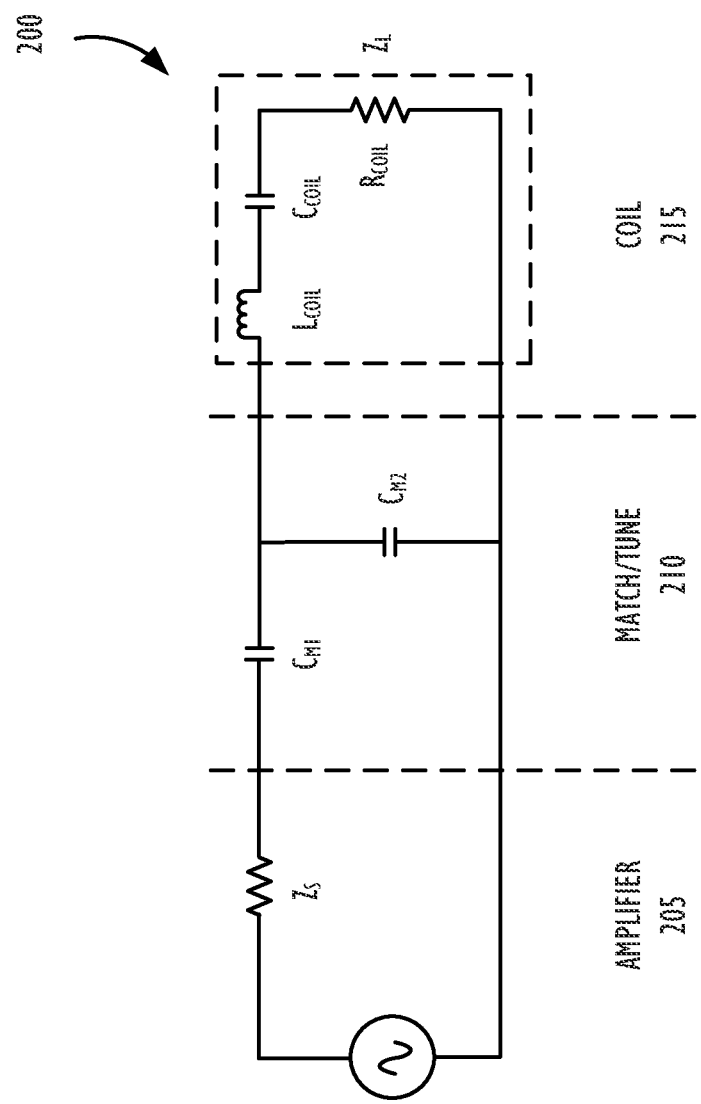
FIG. 2 is a schematic diagram of an equivalent circuit of a coil in a transmit coil array in accordance with an embodiment of the disclosure.

Referring to FIG. 2, an equivalent circuit 200 of a single coil of the drive system of the RF transmit array of FIG. 1 is illustrated as divided into an amplifier section 205, a match/tune section 210, and a coil section 215. For purposes of clarity, the equivalent circuit 200 illustrates a single coil of the array. In actuality, the equivalent circuit for an entire array would include a coil section 215 for each coil in the array connected in parallel. The amplifier section 205 generates the amplified RF signal and exhibits an output impedance of $Z_S$ (typically 50 ohms). The match/tune section 210 has a first variable capacitor $C_{M1}$ in parallel with a second variable capacitor $C_{M2}$. By adjusting these capacitors, the impedance of the system (including the impedance of the match/tune section 210, the impedance of the transmission lines, and the impedance of the individual coils of the transmit array) at the output terminals of the amplifier section 205 can be matched to the output impedance $Z_S$ of the amplifier section 205. As is known to those skilled in the art, the match/tune section 210 may comprise various other electrical components to achieve the same objective. Finally, the coil section 215 is shown as including an inductive component $L_{COIL}$, a capacitive component $C_{COIL}$, and a resistive component $R_{COIL}$. Together, these components define the total impedance $Z_L$ of the coil section 215.

Referring to FIG. 3, a connection between the common voltage point 135 and the input terminal 305 of a single coil in the transmit array is illustrated. For purposes of clarity, FIG. 3 only illustrates the connection between the common voltage point 135 and the input terminal 305 for a single coil in the transmit array. In the illustrated embodiment, the inner conductor 310 of a coaxial cable transmission line 140 connects the common voltage point 135 to the input terminal 305 of the coil. In one embodiment, the inner conductor 310 may be soldered to the common voltage point 135 on a termination board. In such an embodiment, the inner conductor 315 of the transmission line 145 that feeds the common voltage point 135, as well as the conductors that feed each of the additional coils in the transmit array 105, would also be soldered to the common voltage point 135 on the termination board. Additionally, the outer shield of the coaxial cable 145 and the coaxial cables 140 may be connected to a common ground reference. According to transmission line theory, the voltage as a function of position along inner conductor 310 of transmission line 140 is given by:

$$V(z) = \frac{I_L}{2}\left[(Z_L + Z_0)e^{\gamma z} + (Z_L - Z_0)e^{-\gamma z}\right]$$

where $I_L$ is the current at the input terminal 305 of the coil, $Z_0$ is the characteristic impedance of the transmission line 140, and $Z_L$ is the load impedance (which, as described above, varies based on the loading of the coil and the mutual coupling with other coils). Rearranging this equation to solve for the current at the input terminal 305 of the coil yields:

$$I_L = \frac{2V(z)}{[(Z_L + Z_0)e^{\gamma z'} + (Z_L - Z_0)e^{-\gamma z'}]}$$

Therefore, the current at the input terminal 305 of the coil is dependent upon $Z_L$. Because $Z_L$ changes in coupled coils, the current at the input terminal 305 is not controlled.

However, when the electrical length of inner conductor 310 of transmission line 110 between the common voltage point 135 and the input terminal 305 is equal to one quarter wavelength of the signal propagating in the transmission line 140, the voltage as a function of position along inner conductor 310 of transmission line 140 is given by:

$$V\left(\frac{\lambda}{4}\right) = \frac{I_L}{2}\left[(Z_L + Z_0)e^{j\frac{\pi}{2}} + (Z_L - Z_0)e^{-j\frac{\pi}{2}}\right]$$

so, $V\left(\frac{\lambda}{4}\right) = jI_L Z_0$ and, $I_L = \frac{V(\lambda/4)}{jZ_0}$ As such, when a coil is connected to the common voltage point 135 through a quarter wavelength line, the current at the input terminal 305 of the coil is independent of the coil impedance $Z_L$. Moreover, because $V(\lambda/4)$ (i.e., the voltage at the common voltage point 135) is common for each coil, the current at the input to each coil is the same, independent of the load and mutual coupling between the coils. It should be noted that a similar result occurs for any transmission line length of $N\lambda/4$ where N is an odd number greater than zero. Moreover, adding an additional $\lambda/2$ transmission line causes a phase reversal on those elements with the additional line (i.e., elements connected by lines of length $((N+1)/4)\lambda$ have opposite phase from elements connected by lines of $((N+3)/4)\lambda$ where N is an integer including zero). Therefore, according to this principle of forced current excitation, currents having an equal magnitude can be supplied from a single amplifier to each coil in a transmit array by controlling the length of the transmission line connecting each coil to a common voltage point, regardless of the load or mutual coupling between the coils.

The wavelength of a signal propagating in a transmission line is given by:

$$\lambda_{TL} = \frac{u_p}{f}$$

where $u_p$ is the phase velocity and f is the frequency of the propagating signal. The phase velocity is given by:

$$u_p = c^* v_f$$

where $v_f$ is the velocity factor and c is the speed of light. A common velocity factor for coaxial cables is 0.66. Therefore, at the approximately 300 MHz Larmor frequency for $^1$H imaging at 7 T, a quarter wavelength line may be approximately 66 cm in length.

Referring to FIG. 4, the connection of multiple coils of a transmit array 105 in accordance with a particular embodiment of the forced current excitation principle is illustrated. Here again, a coaxial cable 145 conducts a signal from the match and tune circuitry to the common voltage point 135. The inner conductors of each of coaxial cables 140A/B/N are connected to the inner conductor of coaxial cable 145 at the common voltage point 135. Moreover, the outer shields of coaxial cables 140A/B/N are connected to a ground reference. For example, the outer shields of coaxial cables 140A/B/N may be connected to the outer shield of coaxial cable 145, which in turn may be tied to a ground reference with respect to the amplifier 120. Typically, a balun 405A/B/N converts the unbalanced coaxial cable 140A/B/N to the balanced coil and establishes a virtual ground at the output terminal 410A/B/N of each coil. As is known by those skilled in the art, many different balun arrangements are possible. In one particular application, for example, the inner conductor of a one half wavelength ($\lambda/2$) length of coaxial cable is linked at each end to the input terminal 305 and the output terminal 410 of a coil. The inner conductor 310 of the feeder cable 140 is then connected to the coil input terminal 305 and the outer shields of the feeder cable 140 and the half-wavelength cable are connected together. It should be noted that regardless of the balun configuration, the quarter wave transmission line length between the common voltage point 135 and the input terminal 305 includes the length of any signal conducting medium within the balun 405. As such, this length must be accounted for. Because the electrical length of the inner conductor 310A/B/N carrying the RF signal between the common voltage point 135 and the input terminal 305 of each of the coils is a quarter wavelength, an equal current is supplied to each of the coils regardless of the load on an individual coil or the mutual coupling between the coils. While the depicted embodiment illustrates the connection of an inner conductor of a coaxial cable from the common voltage point to each of the coils, it should be understood that the invention is not so limited. Instead, the described principle of forced current excitation applies to any arrangement in which multiple coils of a transmit array are supplied with a RF signal from a common voltage point by any transmission medium having an electrical length of an odd integer multiple of one quarter wavelength. For example, the connections between the common voltage point 135 and the coil input terminals 305A/B/N may be a circuit representing the necessary quarter wave (or odd multiple) delays or may be another form of transmission line.

Figure 5:
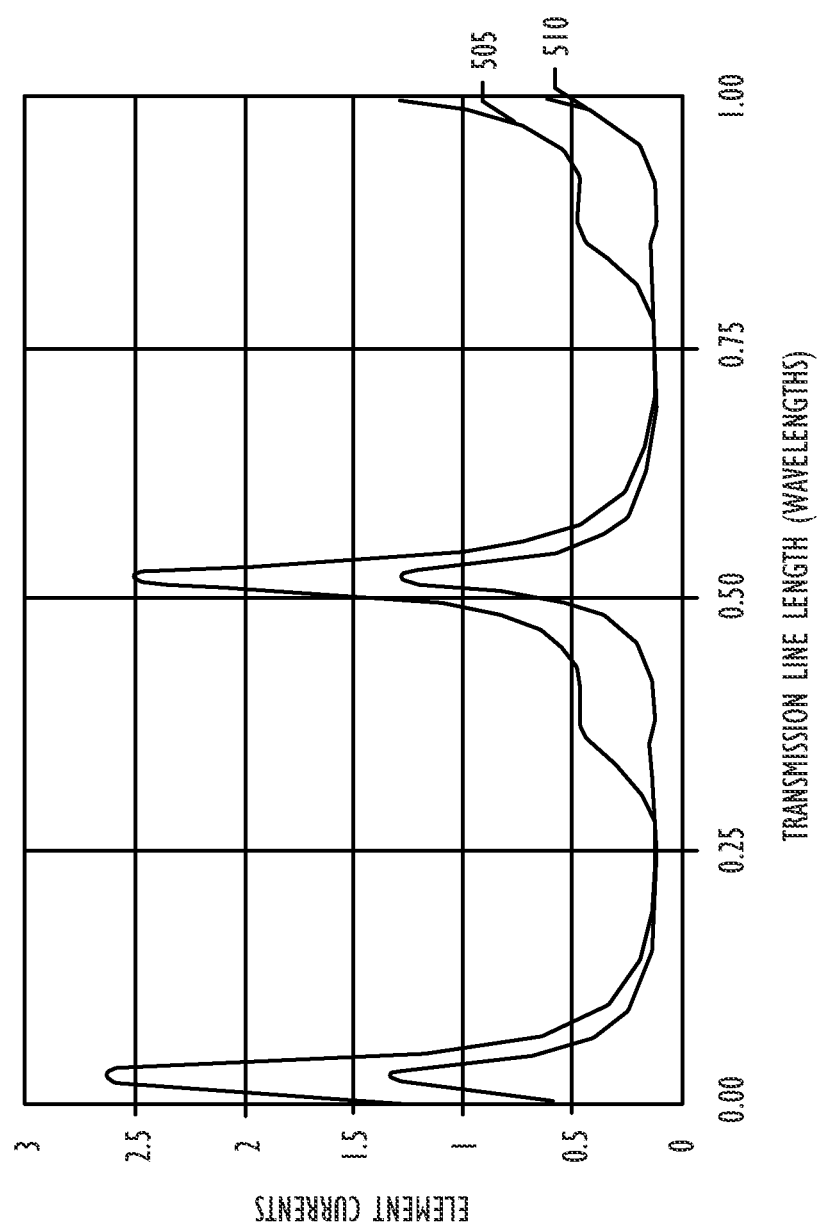
FIG. 5 is a graph illustrating the current through each uniquely loaded coil of a two coil transmit array as a function of the length of the transmission line connecting the coils to a common voltage point.

Referring to FIG. 5, the forced current excitation principle is illustrated graphically. To illustrate the method, a breast coil array having two identical loops (505 and 510) used for imaging at 7.0 T was modeled. The two loops were 16 cm in diameter, and spaced 8 cm apart. The array was loaded on only one side (coil 510), with a material with a conductivity of 0.3 siemens per meter (S/m), to generate an asymmetry in the loading, simulating the placement of one coil of the array proximate the chest wall. The relative current through each of the coils (505 and 510) as a function of transmission line length is plotted in FIG. 5. As expected, with a transmission line length of 0 wavelengths, equivalent to a simple parallel connection, the loop currents are quite different. However, when the transmission line is 0.25 wavelengths long or 0.75 wavelengths long, the currents in the two loops are equal. This analysis illustrates that equal currents can be delivered to each coil in a transmit array by controlling the transmission line length from a common voltage point to the input terminal of each coil to an odd integer multiple of one quarter wavelength of the signal propagating in the transmission line.

Figure 6A:
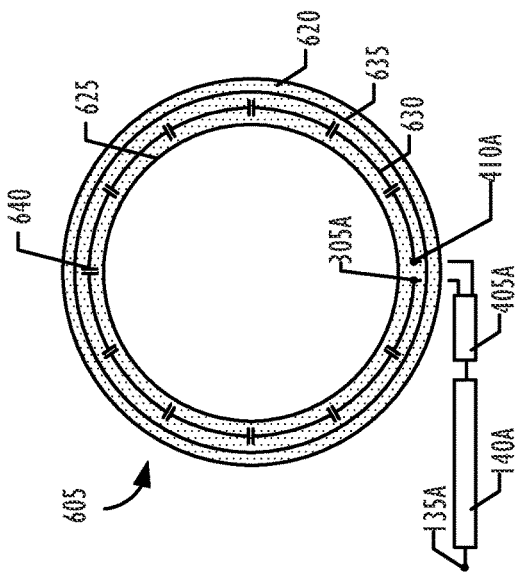
FIGS. 6A-6C illustrate a particular implementation of a volume transmit coil array in accordance with an embodiment of the disclosure.

Referring to FIG. 6A, a perspective view of a particular implementation of the forced current excitation method is illustrated. A breast coil array 600 has a cylindrical shape and includes a pair of circular coil assemblies 605 arranged in a Helmholtz configuration at each end of the cylinder and a pair of coil assemblies 610 arranged in a saddle configuration around the sides of the cylinder. The coil assemblies 605 and 610 are affixed to a cylindrical acrylic tube housing 615.

Figure 6B:
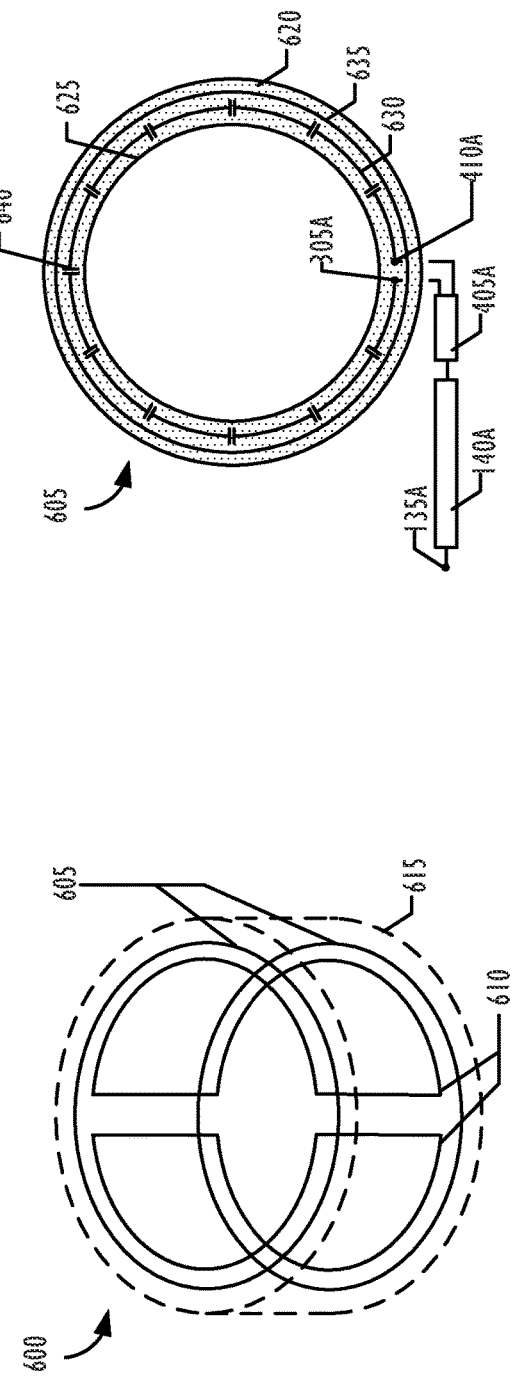

Referring to FIG. 6B, each coil assembly 605 is formed on a printed circuit board 620 having a circular shape with a hole 625 in the center. The tissue to be imaged is placed through the hole 625 of one of the coil assemblies 605. The coil assembly 605 consists of a circular coil 630 and a concentric and coplanar outer shield 635. The coil 630 is formed of copper and has an inner diameter of 160 mm and an outer diameter of 172 mm. The outer shield 635 is formed of copper and has an inner diameter of 180 mm and an outer diameter of 187 mm. The coil 630 contains twelve breaks of 2 mm spaced equally around the circumference, resulting in twelve arc segments of 41.5 mm. Within each break, except for the break at the coil feed point, two capacitors (having a combined nominal value of 12.1 pF) are placed in parallel (illustrated as a single capacitor 640). The two coil assemblies 605 are positioned coaxially within the array 600 spaced 80 mm apart with the copper elements and electrical components for each coil assembly 605 facing towards the interior of the coil volume. The total electrical length of the conductor carrying the RF signal from the common voltage point 135A through the transmission line 140A and the balun 405A to the coil input terminal 305A is equivalent to an odd integer multiple of one quarter wavelength of the RF signal. The balun 405A establishes a virtual ground at the output terminal 410A.

Figure 6C:
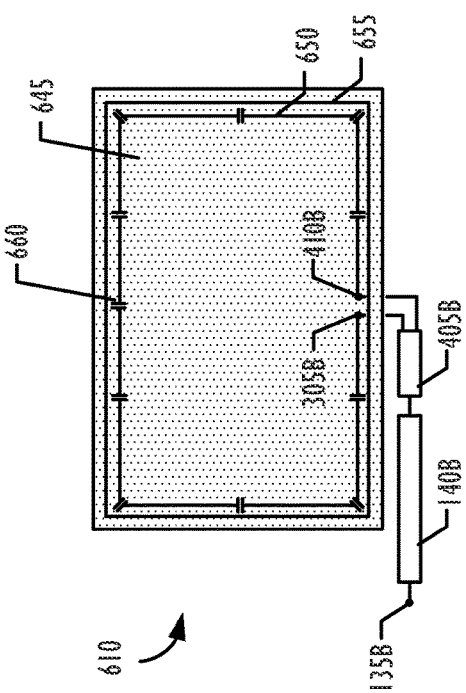

Referring to FIG. 6C, each coil assembly 610 is formed on a printed circuit board 645. The coil assembly 610 consists of a rectangular coil 650 and an outer shield 655. The coil 650 is formed of copper and has inner measurements (when flat) of 153 mm wide and 81.4 mm tall and outer measurements (when flat) of 165.2 mm wide and 93.6 mm tall. The outer shield 655 is formed of copper and has a trace width of 18 mm spaced 4.5 mm outside of the coil 650. Spaced around the coil 650 are twelve 2 mm breaks. These breaks form four segments of 37 mm in length along the top and bottom of the rectangular coil 650 and two segments of 40 mm in length along the sides of the rectangular coil 650. Within each break, except for the break at the coil feed point, two capacitors (having a combined nominal value of 13.0 pF) are placed in parallel (illustrated as a single capacitor 660). Each of the two coil assemblies 610 is mounted on the inside of the 152 mm diameter acrylic tube housing 615 and has an angular aperture of 120°. The total electrical length of the conductor carrying the RF signal from the common voltage point 135B (different from the common voltage point 135A of the Helmholtz pair) through the transmission line 140B and the balun 405B to the coil input terminal 305B is equivalent to an odd integer multiple of one quarter wavelength of the RF signal. The balun 405B establishes a virtual ground at the output terminal 410B.

The coil assemblies 605 and 610 can be supplied from the same or different amplifiers. Although the individual coils are loaded differently and may exhibit strong inductive coupling, because each pair is supplied from a common voltage point through a transmission line having an electrical length equal to a quarter wavelength, the current in each coil is independent of the load on the coil and the mutual impedance between the coils. Accordingly, based on the described technique of forced current excitation, equal currents can be enforced at each of the elements of the breast coil array 600. While FIG. 6 has described the forced current excitation technique with respect to a particular volume transmit coil array 600, it will be understood that the technique applies to any array configuration in which elements of the array are coupled to a common voltage point through a transmission line having an electrical length equal to $N\lambda/4$ where N is an odd integer. For example, the coils arranged in the saddle and Helmholtz configurations do not need to be the same size or be positioned in the manner illustrated. In an alternate arrangement, the pair of coils arranged in the saddle configuration may be omitted and the coil array may comprise two pairs of coils arranged in a Helmholtz configuration (e.g., one for each breast). Moreover, the coil assemblies 605 and 610 need not be formed on a printed circuit board.

It is to be understood that the above description and examples are intended to be illustrative, and not restrictive. For example, the above-described embodiments may be used in combination with each other. Many other embodiments will be apparent to those of skill in the art upon reviewing the above description.

The invention claimed is:

1. An imaging apparatus, comprising:
   a radio frequency signal generator that generates a radio frequency signal at a common node;
   a plurality of transmit coils arranged in an array that is positionable around a volume of tissue for imaging, each coil of the plurality of transmit coils having an input terminal that receives a uniform current, wherein the plurality of transmit coils comprise:
   a pair of coils arranged in a saddle configuration, the saddle configuration comprising linear segments and arcuate segments; and
   a pair of circular coils arranged in a Helmholtz configuration, wherein the pair of circular coils are concentric with the arcuate segments of the pair of coils arranged in a saddle configuration;
   a plurality of transmission line segments, wherein each transmission line segment conducts the radio frequency signal from the common node to the input terminal of one of the plurality of transmit coils, wherein each of the plurality of transmission line segments comprises a circuit that provides an odd integer multiple of one quarter of a wavelength of the signal in the transmission line segment.

2. The imaging apparatus of claim 1, wherein a first static magnetic field has a first static magnetic field strength.

3. The imaging apparatus of claim 2, wherein the signal has a frequency that corresponds to a resonance frequency of a first atomic nucleus in the tissue at the first static magnetic field strength.

4. The imaging apparatus of claim 1, wherein each of the plurality of transmission line segments comprises a coaxial cable.

5. The imaging apparatus of claim 1, wherein a first one of the plurality of transmission line segments has a length that exceeds that of a second one of the plurality of transmission line segments by an amount equal to a multiple of one half of the wavelength of the signal in the first one of the plurality of transmission line segments.

6. The imaging apparatus of claim 1, wherein the array is a breast coil array.

7. The imaging apparatus of claim 1, wherein the pair of coils arranged in the saddle configuration and the pair of circular coils arranged in the Helmholtz configuration are positioned about a cylindrical structure.

8. The imaging apparatus of claim 1, wherein each of the coils arranged in the saddle configuration and each of the circular coils arranged in the Helmholtz configuration is formed on a printed circuit board.

9. The imaging apparatus of claim 1, further comprising an amplifier, wherein the amplifier increases power of the radio frequency signal generated by the radio frequency signal generator, and to provide the increased power signal to the common node.

10. The imaging apparatus of claim 9, further comprising:
   match and tune circuitry coupled between the amplifier and the common node; and
   wherein the match and tune circuitry comprises a first variable capacitor and a second variable capacitor, the first variable capacitor being arranged in parallel with the second variable capacitor.

11. The imaging apparatus of claim 2, wherein the first static magnetic field has a strength that is greater than or equal to 3 Tesla.

12. The imaging apparatus of claim 1, wherein at least one of the transmit coils comprises a plurality of capacitors along its length.

13. The imaging apparatus of claim 1, wherein each circular coil of the pair of circular coils comprises:
   a metallic circular coil comprising a plurality of equally spaced breaks disposed about a circumference of the metallic circular coil, wherein the equally spaced breaks create arc segments of equal length;
   a coil feed point disposed between one pair of adjacent arc segments of equal length and a pair of capacitors disposed between each remaining adjacent arc segments of equal length; and
   a metallic shield that concentrically surrounds an outer portion of the metallic circular coil.

14. The imaging apparatus of claim 1, wherein each coil of the pair of coils arranged in a saddle configuration comprises:
   a metallic rectangular coil comprising a plurality of equally spaced breaks disposed about a perimeter of the metallic rectangular coil, wherein the equally spaced breaks create segments of equal length;
   a coil feed point disposed between one pair of adjacent arc segments of equal length and a pair of capacitors disposed between each remaining adjacent arc segments of equal length; and
   a metallic shield that surrounds an outer portion of the metallic rectangular coil.

15. The imaging apparatus of claim 1, wherein each of the pair of coils arranged in a saddle configuration and each of the pair of circular coils comprises a plurality of breaks, and wherein two capacitors are placed in parallel between each of the plurality of breaks.

* * * * *